United States Patent [19]
McHugh

[11] Patent Number: 5,259,771
[45] Date of Patent: Nov. 9, 1993

[54] LOW PROFILE CHIP CARRIER SOCKET

[75] Inventor: Robert G. McHugh, Pleasanton, Calif.

[73] Assignee: Foxconn International, Inc., Sunnyvale, Calif.

[21] Appl. No.: 933,257

[22] Filed: Aug. 21, 1992

[51] Int. Cl.⁵ ............................................... H01R 9/09
[52] U.S. Cl. .................................... 439/68; 439/70; 439/73; 439/331; 439/525; 439/526
[58] Field of Search .............. 439/68, 70, 73, 330, 439/331, 525, 526

[56] References Cited

U.S. PATENT DOCUMENTS

| | | | |
|---|---|---|---|
| 3,656,183 | 4/1972 | Walterscheid | 439/73 |
| 4,688,870 | 8/1987 | Egawa et al. | 439/70 |
| 5,154,620 | 10/1992 | Martucci et al. | 439/73 |

Primary Examiner—Paula A. Bradley

[57] ABSTRACT

A chip carrier socket assembly (10) for electrical connecting leads (81) on a chip carrier (80) to a board on which the socket is seated, comprises a base (20) having a chip carrier receiving opening (22) in relation to peripheral walls (24) thereof. A plurality of lower contacts (70) are disposed in the base (20) for electrical connecting to the respective printed circuit board pads. The socket (10) further includes a cover (40) complementarily positioned on the base (20). The cover (40) has therethrough a central opening corresponding to the opening (22) of the base (20) and surrounded by circumferential walls (44). A corresponding plurality of upper contacts (60) are disposed in the cover (40) for mechanically pressing against and electrically connecting to the leads (81) of the chip carrier (80). The chip carrier (80) can be retained within the cover (40) by means of the upper contacts (60) thereof without regard to the base (20). The upper contacts may connected to the lower contacts so that no other additional securing means are required to lock the cover and the base together.

18 Claims, 7 Drawing Sheets

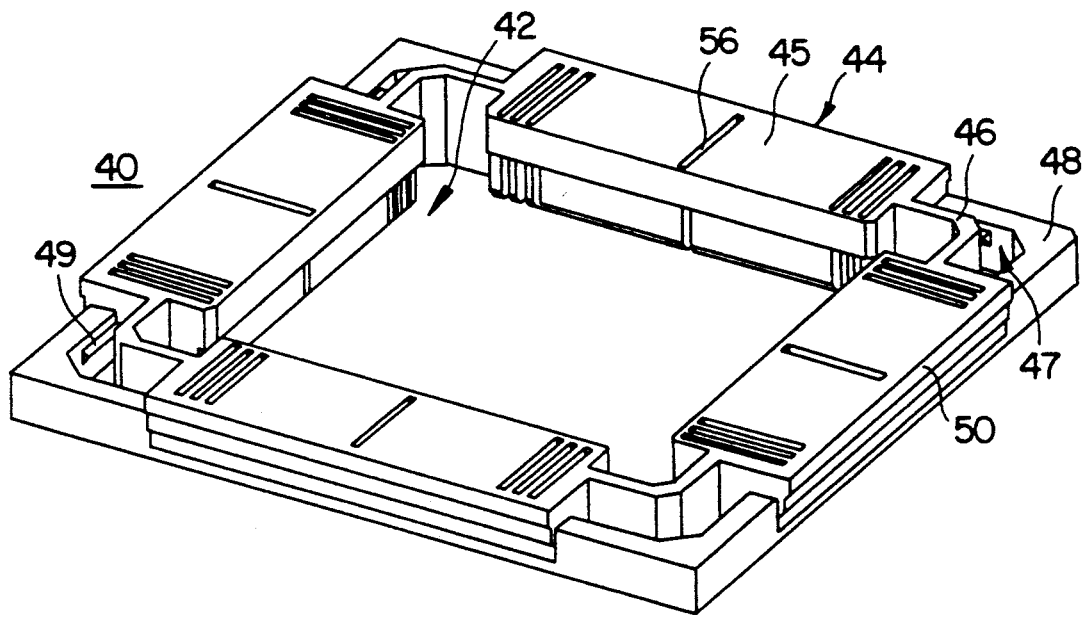
F I G. 3(A)
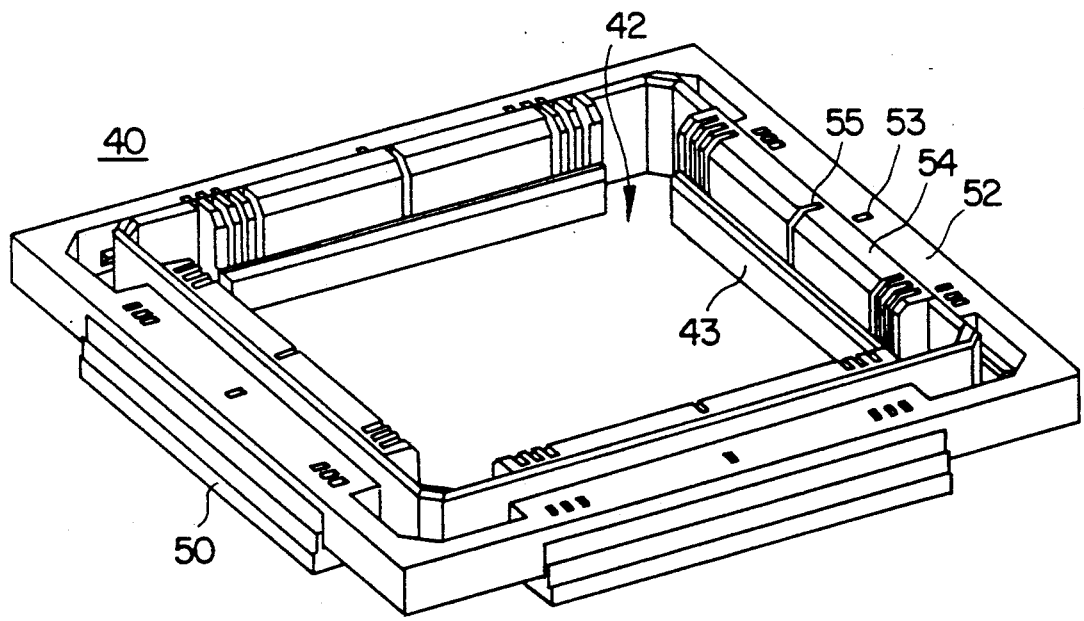
F I G. 3(B)

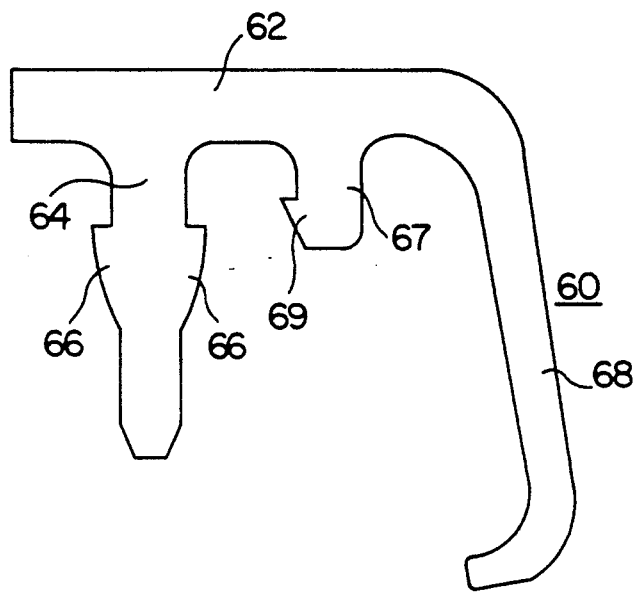
F I G. 5(A)
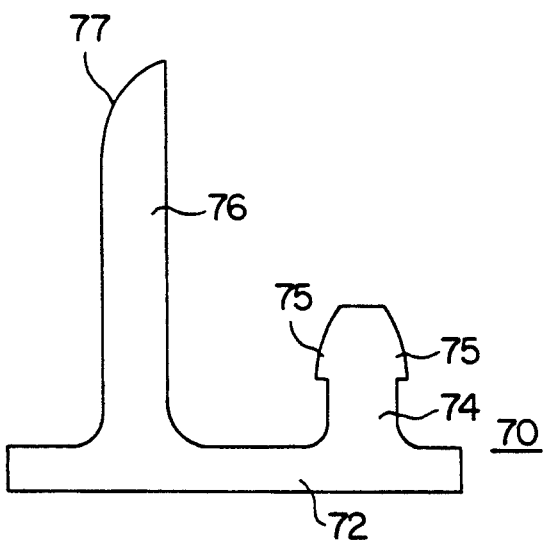
F I G. 5(B)

LOW PROFILE CHIP CARRIER SOCKET

BACKGROUND OF THE INVENTION

1. Field of The Invention

The present invention relates to sockets for integrated circuit chip carriers having flexible leads and, more particularly to a low profile chip carrier socket of a surface mount type for electrically connecting such a carrier to conductors on a substrate.

2. Description of The Prior Art

With regard to chip carrier sockets, the prior art can be characterized by basically two types. The first type can be represented by Plastic Leaded Chip Carrier (PLCC) socket in which the chip carrier is retained only by means of engagement between the contacts of the socket and the leads of the chip carrier, for example, U.S. Pat. Nos. 4,630,875, 4,645,279, 4,679,871, 4,710,134 and 4,941,832. The disadvantage of this type socket is shortage of reliably sufficient retention of the chip within the socket, so the chip carrier may be subject to removal from the socket if a vibration occurs thereof.

Compared with the first type socket, the second type socket furthermore has an additional cover latchably positioned on the socket base for assuring that the chip carrier seated within the socket is impossible to leave therefrom even in a worst vibration situation. This type socket can be represented by Plastic Quad Flat Pack (PQFP) socket, and includes U.S. Pat. Nos. 4,427,249, 4,583,806, 4,691,975, 4,746,299, 4,758,176, 4,846,704, 4,872,845, 4,886,470, 4,887,969, 4,968,259, 5,007,845 and 5,009,609. In this type socket, the common way to couple the leads of the chip carrier to the contacts of the socket is to use a projecting bar which integrally extends from the cover and directly presses the leads against the contacts or directly presses the contacts against the leads.

Regardless of either aforementioned type, the contact of the socket needs not only a desired resilient character which can provide a bumper function to reduce the influence due to vibration and can lower the insertion force of the chip carrier required when the chip carrier is loaded into the socket such as the PLCC socket, but also a sufficient retention strength which can efficiently make the contact tightly mechanically engage the lead of the chip carrier for reliable electrical connection. It can be seen that the contacts shown in the aforementioned U.S. Pat. Nos. 4,691,975, 4,846,704, 4,886,470 and 5,009,609, are at best shaped curved in order to achieve such functions. Unfortunately, generally in the socket there is no sufficient room for a contact design which has a compound curvilinear configuration. Also, an improper complex curved shape of the contact will make signal paths long to thereby increase inductive reactance and delay signal transmission.

For the PQFP socket, although the retention factor may not be so critical for the contact due to the fact that the additional cover will provide the necessary engagement force between the leads of the chip carrier and the contacts of the socket, and assure that the chip carrier can not leave from the socket, it is still required that the contact have a proper resilience which can absorb the amount of vibration energy occurring thereof for preventing the fragile leads from damage. This requirement results from the fact that in the current PQFP sockets, the projecting bar which presses against the contacts or the leads is integrally formed of the socket which is made of plastic, thus providing a poor bumping effect in relation to the contacts or the leads.

Another problem in some PQFP sockets is due to the additional cover. Generally speaking, the cover occupies a significantly great space relative to the socket base in a vertical direction. In contrast, with the introduction of notebook computers, the need has arisen to develop lower height sockets for chip carriers so the profile of the computer can be kept as slim as possible. However, the standard PQFP chip carrier has maximum allowable height of 4.57 mm, and the current PQFP socket, including the cover to sandwich the chip therebetween, has an overall height exceeding 9 mm. This height is too great for use in a notebook computer.

One reason for this thicker dimension of the socket is that it is uneasy to design a contact in a small space to connect with the chip lead from the bottom side of the socket while still keeping the contact owning the sufficient desired resilience and retention force. Another reason is related to the structure and the positioned of the cover in relation to the socket base, so the combination of the cover and the socket base where the chip carrier is positioned has such a considerable height.

Accordingly, to improve the first problem, an optional design is to load the contacts from the top so that it is easier to design a contact configuration providing a sufficiently proper downward retention force for engagement with the corresponding lead of the chip carrier. While, for a surface mount socket because the bottom portion of the contact is required to extend horizontally and mount on the board on which the socket is seated, it is almost impossible to have a unitary surface mount contact loaded into the socket from the top. Accordingly, using a two-piece contact, i.e. an upper contact loaded from the top and a lower contact loaded from the bottom, to replace the original one-piece contact for facilitating the better electrical connection among the lead of the chip carrier, the board, and the contact itself, is an object of the present invention.

Another object of the present invention is to provide a PQFP socket having upper contacts corresponding to respective leads of the chip carrier and lower contacts. The upper contacts replace the current projecting bars to press the leads of the chip carrier against the lower contacts for enhancement of contact force therebetween.

Still, an object of the present invention is to provide a PQFP socket in which the cover may not need additional securing means to latchably engaging the socket base. In other words, the combination via the upper contacts and the lower contacts provides the sufficient retention force to sandwich the chip carrier between the cover and the socket base without other additional latch means.

Yet, another object of the present invention is to provide a PQFP socket in which the chip carrier can be retained within the central opening of the cover first, and then the chip associated with the cover is positioned onto the socket. This feature is different from the current PQFP socket assembly where the chip carrier is required to be assembled to the socket base first, and then the cover is fastened to the socket base to retain the chip carrier therebetween. This unique feature makes assembly process flexible.

Further, another object of the present invention is to provide a PQFP socket which has restricting bars or retention sections to abut against the fixed ends of the leads of the chip carrier for prevent the chip carrier from upward movement.

SUMMARY OF THE INVENTION

In accordance with the present invention, an electrical connector includes a chip carrier socket for electrically connecting leads on the chip carrier to respective pads on a mounting board. The leads are spaced apart and project from a peripheral edge of the chip carrier. The socket includes a base having a chip carrier receiving central opening in relation to peripheral walls thereof. A plurality of lower contacts are disposed in the base for electrical connecting to the respective printed circuit board pads. The socket further includes a cover complementarily positioned on the base. The cover has therethrough a central opening corresponding to the opening of the socket and surrounded by circumferential walls. A corresponding plurality of upper contacts are disposed in the cover for mechanically pressing against and electrically connecting to the leads of the chip carrier. The chip carrier can be retained within the cover by means of the upper contacts thereof without regard to the base. The upper contacts may connected to the lower contacts so that no other additional securing means are required to lock the cover and the base together.

BRIEF DESCRIPTION OF THE DRAWINGS

FIG. 3(A) is a top perspective view of a cover of the socket assembly of FIG. 1.

FIG. 3(B) is a top perspective view of a upside-down cover of FIG. 2(B) to illustrate a bottom side of the cover.

FIG. 5(A) is a plane view of an upper contact of FIG. 4.

FIG. 5(B) is a plane view of a lower contact of FIG. 4.

DETAILED DESCRIPTION OF THE PREFERRED EMBODIMENT

Reference will now be made in detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Figure 1:
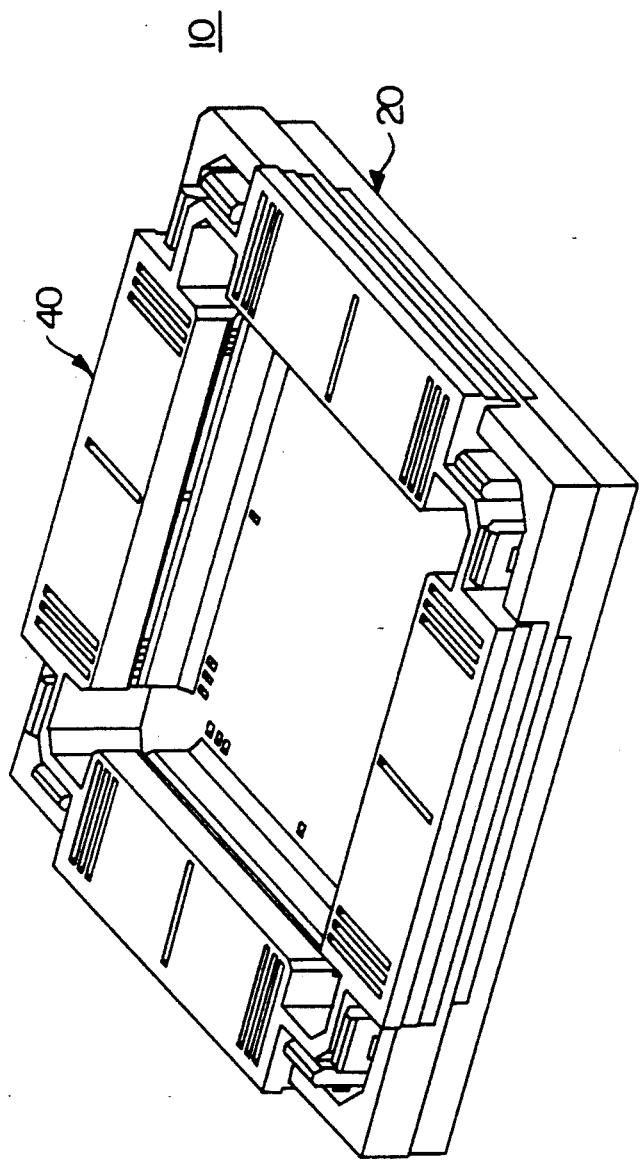
FIG. 1 is a top perspective view of a chip carrier socket assembly without contacts and the chip carrier therein in accordance with the present invention.
Figure 2A:
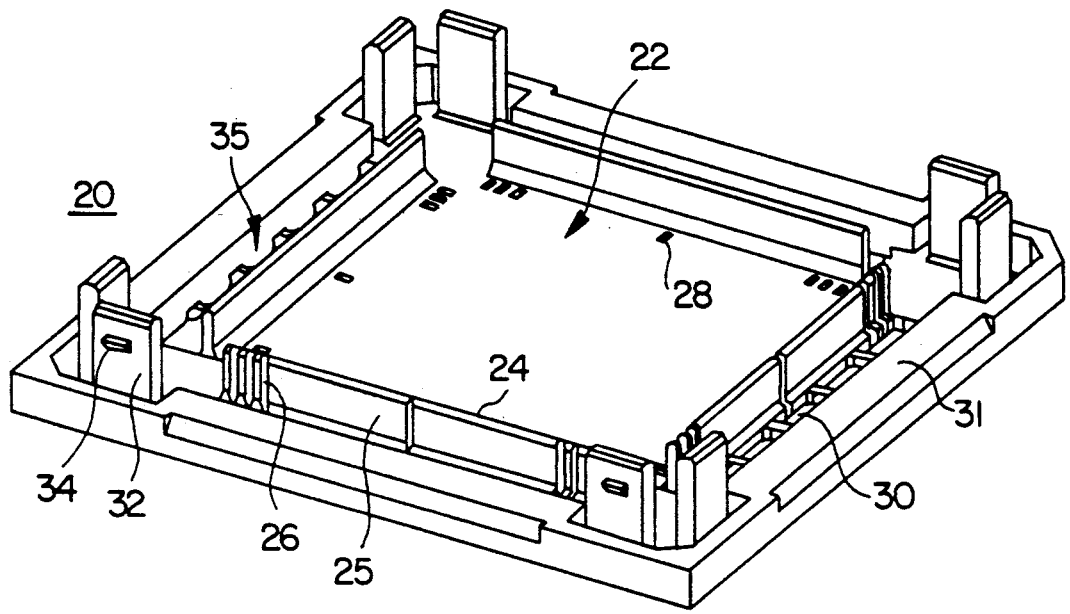
FIG. 2(A) is a top perspective view of a base of the socket assembly of FIG. 1.
Figure 4:
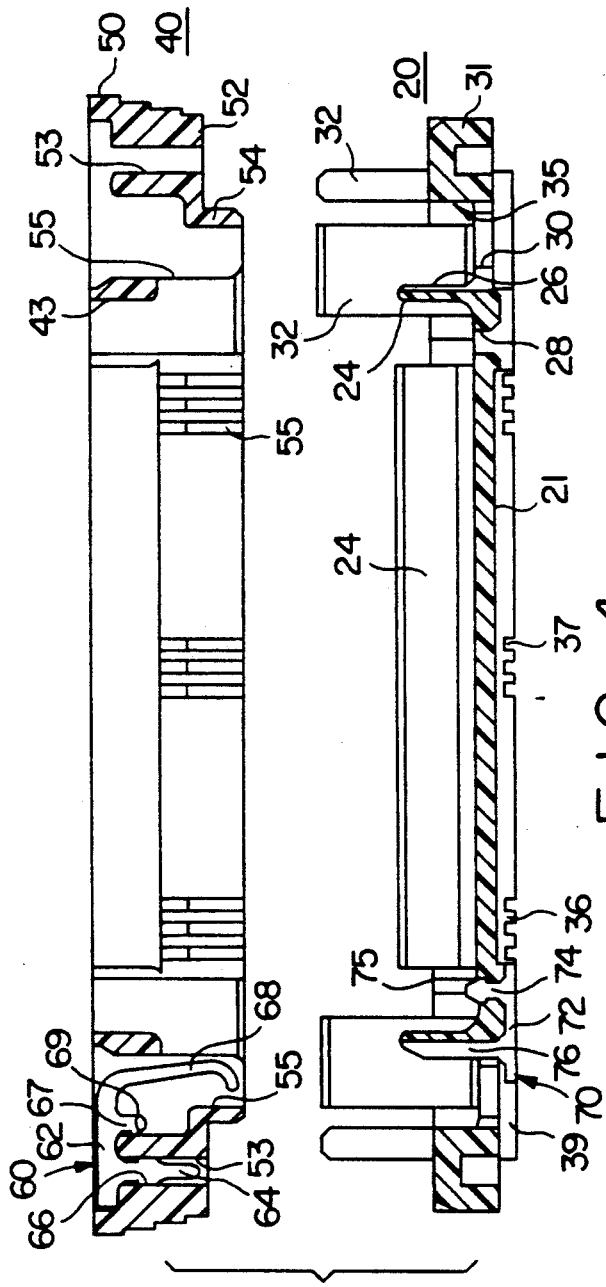
FIG. 4 is a cross-sectional exploded view of the socket of FIG. 1 wherein the right side illustrates the inner structures of the socket and the cover and the left side illustrates the contacts incorporating therein.

It will be noted here that for a better understanding, like components are designated by like reference numerals throughout the various figures. Attention is now directed to FIG. 1 showing a chip carrier socket assembly 10 which includes a cover 40 in an upper position and a base 20 in a lower position. Referring to FIGS. 2(A) and 4, the base 20 which is of molded plastic unitary construction, has a generally square shape and a chip carrier receiving opening 22 in the center portion. Four upstanding walls 24 generally surround the opening 22. A plurality of slots 26 side by side extend through the outer surface 25 of each wall 24 and through the base 20. Opposite to and in alignment with each slot 26, a through-cavity 28 is provided proximate the inner side of the wall 24.

Along each side of the base 20, several through-holes 30 are juxtaposed for purpose of soldering inspection and ventilation for prevention of overheating thereof. In this embodiment, a lower portion of each slot 26 can communicate with the through-hole 30 directly. Upwardly projecting on each corner are a pair of latches 32 forming a generally right angle shape for fixedly securing the cover 40 among these four pairs of latches 32. A protrusion 34 can be positioned on the outer surface of one of selected latches 32 for latchable engagement with the cover. Four relatively lower outer engagement bars 31 are positioned beside and parallel to the four corresponding walls 24, respectively, thereby forming an elongated channel 35 therebetween.

Figure 2B:
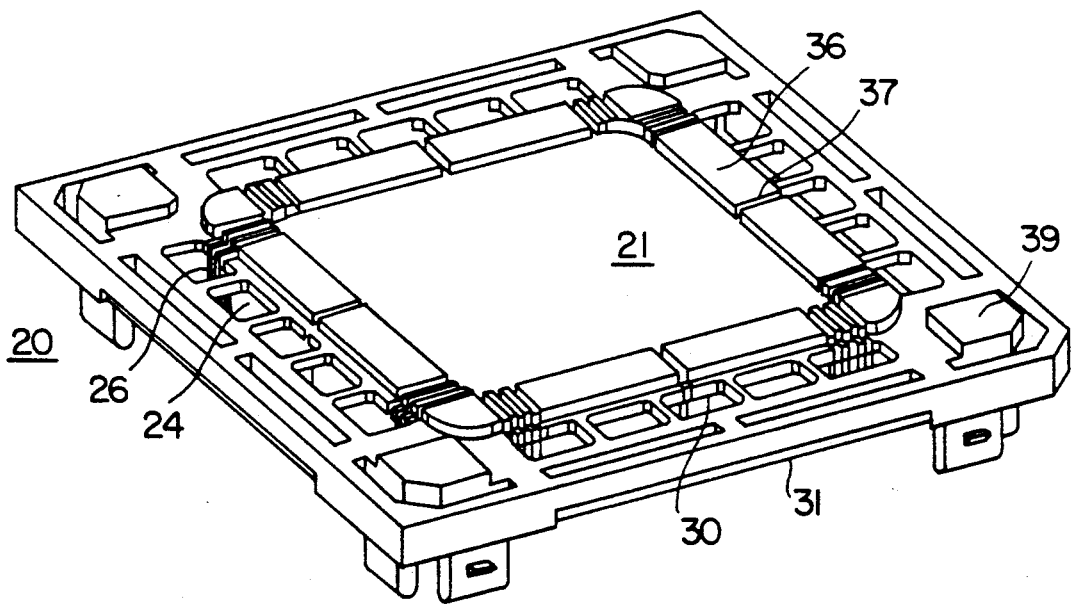
FIG. 2(B) is a top perspective view of a upside-down base of FIG. 2(A) to illustrate a bottom side of the base.

Referring to FIG. 2(B), corresponding to the opening 22, a hollow square type stand-off 36 is formed at the center portion on the bottom surface 21 of the base 20. Aligned and communicating with the corresponding slots 26 and cavities 28, a plurality of parallel grooves 37 are arranged along four sides of the stand-off 36. To be conformable with the central stand-off 36, four same height stand-offs 39 are disposed at four corners on the bottom surface 21 of the base 20.

The square cover 40, as best seen in FIGS. 3(A) and 4, which, similar to the base 20, is of molded plastic unitary construction, is of the approximate shape and outer dimensions of the base 20. The cover 40 has a central through-opening 42 formed by four peripheral walls 44 in a form of end-to-end connection of every two adjacent walls 44. Each wall 44 has a large middle portion 45 for receiving contacts therein and a narrowed portion 46 at either end. A right-angle through-recess 47 are formed at each corner of the cover 40 to receive therein a pair of corresponding latches 32 of the base 20. At least one protrusion 49 is formed in one of the selected recesses 47 to latchably engage the protrusion 34 of the corresponding latch 32 thereby fixedly combining the cover 40 and the base 20 together. At each corner of the cover 40, a shoulder 48 confronts the corresponding recess 47 for easy access of a tool which is intended to disengage the latched protrusions thereof when required.

Also referring to FIG. 4, the side edge 50 of the large portion 45 of each wall 44 is wedged and stepped for easy manual handling. Also referring to FIG. 3(B), the large portion 45 of the cover 40 includes a laterally inwardly extending retention section 43, opposite to the side edge 50, which will engage the leads of the chip carrier when assembled. Referring to FIGS. 3(B) and 4, the larger portion 45 of each wall 44 defines two sections of which, one is the first outer section 52 downwardly abutting the corresponding engagement bar 31 of the base 20, and the other is second inner section 54 laterally facing the corresponding wall 24 of the base 20 and received within the channel 35 of the base 20.

A plurality of through-cavities 53 are side by side positioned in the first section 52 and the corresponding number of open slots 55 are aligned therewith in the second section 54. The slots 55 communicate with the corresponding cavities 53, respectively, as well as with the corresponding slots 26 of the base 20. A plurality of upward facing openings 56 are formed on the top surface of the large portion 45, each of which communicates with both the corresponding cavity 53 and slot 55.

Two-piece flat contacts are used in the present invention. As shown in FIGS. 4 and 5(A), an upper contact 60 can be loaded from the top into the corresponding opening 56 of the cover 40. The upper contact 60 has a horizonal body 62 parallel to the top surface of the cover, a main retention section 64 downwardly extending from the body 62 and having a pair of lateral barbs 66 thereon, a curvilinear contact section 68 obliquely and downwardly extending from the inner end of the body 62, and an auxiliary retention section 67 downwardly extending between the main retention section 64 and the contact section 68 and having thereon a barb 69 facing opposite to contact section 68. When assembled, the body 62 is positioned below the top surface of the cover 40, the main retention section 64 is received in the cavity 53 by engagement of the barbs 66 therewith, and the auxiliary retention section 67 and the contact section 68 are both received within the corresponding slot 55 in engagement of the barb 69 therewith.

As shown in FIGS. 4 and 5(B), an lower contact 70 can be loaded from the bottom of the base 20. Each contact 70 has a horizontal main body 72 for surface mount use with a main board, a retention section 74 upwardly extending therefrom and having a pair of lateral barbs 75 thereon, and a contact section 76 therefrom upwardly extending opposite to the retention section 74 with a curved sliding region 77 at the top for coupling to the lead of the chip carrier. When assembled, the body 72 is positioned within the groove 37, the retention section 74 is received in the cavity 28 of the base 20 by engagement of the barbs 75 therewith, and the contact section 76 is positioned within the corresponding slot 26 in abutment with the wall 24.

Figure 6:
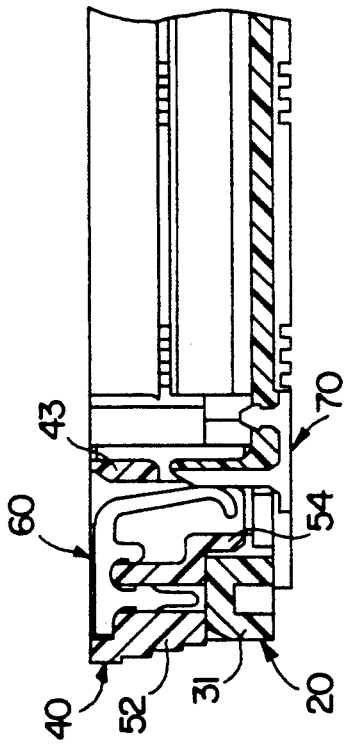
FIG. 6 is a partially cutaway cross-sectional view of the socket assembly of FIG. 1 with the contacts therein but without the chip carrier therein to illustrate the combination of the base of FIGS. 2(A), 2(B) and the cover of FIGS. 3(A), 3(B).
Figure 7:
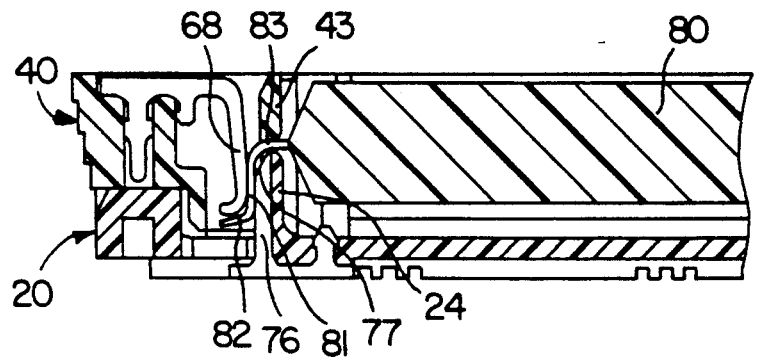
FIG. 7 is a partially cutaway cross-sectional view of the socket assembly of FIG. 1 with the contacts and the chip carrier therein to illustrate the engagement among the leads and the contacts.
Figure 10:
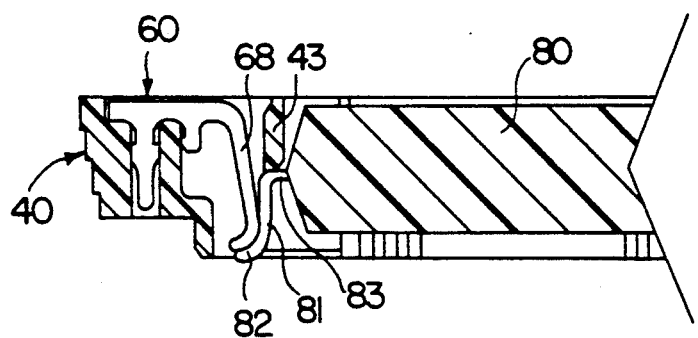
FIG. 10 is a partially cutaway cross-sectional view of the cover of FIGS. 3(A) and 3(B) with the chip carrier therein to illustrate engagement and retention therebetween.

FIG. 6 shows the combination of the cover 40 and the base 20 without the chip carrier therein. In this situation, the contact section 68 of the upper contact 60 rests on the contact section 76 of the lower contact 70 due to the slot 55 of the cover 40 being in alignment with the slot 26 of the base 20. When the socket 10 is assembled with the chip carrier 80, as shown is FIG. 7, the chip carrier 80 may be inserted into the opening 42 of the cover 40 from the bottom and in this state, the free ends 82 of the leads 81 will respectively and upwardly move along the corresponding slots 55 of the cover 40 in engagement with the contact sections 68 of the corresponding upper contacts 60 therein until the fixed ends 83 of the leads 81 abut against the retention sections 43 of the cover 40 whereby the chip carrier 80 can be retained within the opening 42 of the cover 40 because obliquely upwardly lifting forces, which are exerted by the contact sections 68 of the upper contact 60, act on the free ends 82 of the leads 81, as shown in FIG. 10.

Subsequently, the cover 40 associated with the chip carrier 80 therein is coupled to the base 20 from the top. The contact sections 76 of the lower contacts 70 will respectively move into and along the corresponding slots 55 from the bottom because the slots 55 of the cover 40 are respectively aligned with the corresponding slots 26 of the base 20 when the cover 40 and the base 20 are assembled together. Accordingly, the sliding region 77 of each lower contact 70 first contacts the free end 82 of the corresponding lead 80, and gradually moves along the length of the lead 80 until the retention bars 31 of the base 20 abut against the first outer sections 52 of the cover 40. At this time, the top of the wall 24 of the base 20 may slightly touch the fixed ends 83 of the leads 80, and each lead 81 of the chip carrier 80 may sandwiched between the contact section 68 of the corresponding upper contact 60 and the contact section 76 of the corresponding lower contact 70 within the slot 55 of the cover 40.

It can be noted that during assembling, the latches 32 of the base 20 can pass through the corresponding recesses 47 of the cover 40 and the protrusions 34 of the latches 32 will engage the protrusions 49 in the recesses 47 when the cover 40 and the base 20 are in their fixed positions. Accordingly, the cover 40 and the base 20 may be securely assembled together by this engagement unless a specific releasing tool is operated on those engaging portions for disengagement.

It can be understood that the top surface of the cover 40 is almost flush with the top surface of the chip carrier 80 so that the total height of the socket assembly can be reduced to the minimum for a notebook computer use.

It is appreciated that the leads 81 of the chip carrier 80 electrically engage the lower contacts 70 by means of the pressure resulting from respectively the corresponding upper contacts 60 in place of elongated integral retention bars of the cover used in the current PQFP socket. This will make the engagement of each pair of lead 81 and the lower contact 70 resilient and flexible, and provide a better performance thereof.

It can be noted that the upper contacts 60 are loaded from the top so that it is easy to design a proper configuration of the upper contact to exert a sufficiently moderate spring force on the lead 82 of the chip carrier 80 for engagement with the lower contact 70. Besides, the upper contact 60 applies an upward oblique force to proximate the free end 82 of the lead 80 thereby pushing the fixed end 83 of the lead 80 against the retention section 43 of the cover 40 so that the cover 40 needs no additional structure above the chip carrier 80 for retaining the chip carrier 80 therein, thus saving space.

It is contemplated that the leads 81 contact the lower contacts 70 directly and the signal path is considerably short so that inductive reactance can be reduced and the signals are transmitted in a real time. It is also seen in FIG. 10 that in the present invention the chip carrier 80 can be individually retained within the cover 40 without regard to the base 20 so that the assembly procedure can be optionally reconfigured for flexible manufacturing.

It can be understood that the lead 81 is adequately and effectively held among the retention section 43 of the cover 40, the contact section 76 of the lower contact 70 and the contact section 68 of the upper contact 60 so that the signal transmission is reliably prompt.

Figure 9:
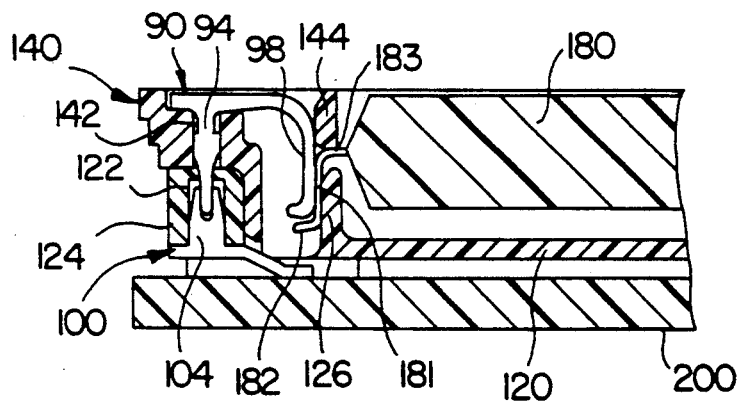
FIG. 9 is a partially cutaway cross-sectional view of a socket assembly of another embodiment incorporating the contacts of FIGS. 8(A) and 8(B).
Figure 8A:
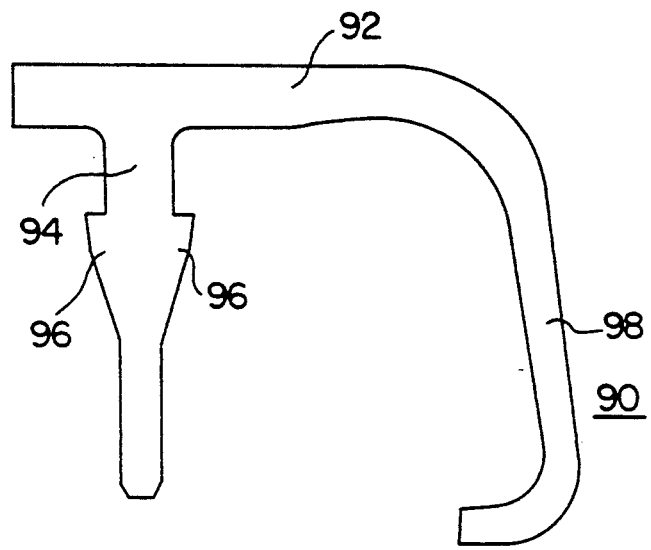
FIG. 8(A) is a plane view of an upper contact of another embodiment in accordance with the present invention.
Figure 8B:
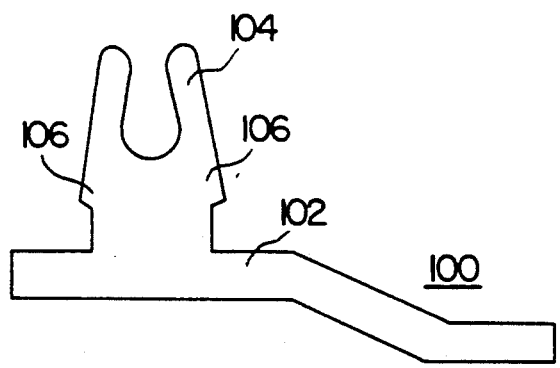
FIG. 8(B) is a plane view of a lower contact to cooperate with the upper contact of FIG. 8(A).

FIGS. 8(A) and 8(B) show another pair of upper contact 90 and lower contact 100 of another embodiment. The upper contact 90 has a generally D-shaped configuration comprising a horizontal body 92, a pin type retention section 94 extending downwardly from horizontal body 92 and a pair of lateral barbs 96 positioned thereon. Opposite to the retention section 94, a curved contact section 98 extends downwardly from an inner end of the horizontal body 92. The lower contact 100 has a biased horizontal body 102 where a tuning fork type retention section 104 extends therefrom. A pair of barbs 106 laterally protrude from two sides of the retention section 104. Referring to FIG. 9, similar to the first embodiment, the socket may be mounted on a board 200 wherein the base 120 of the second embodiment has little difference to that of the first embodiment for accommodating the lower contacts 100 therein. In this embodiment, a plurality of through-cavities 122 are side by side disposed within and along the engagement bar 124 for alignment with and communication with the cavities 142 of the cover 140.

When the socket is fabricated, the upper contact 90 is loaded, from the top, into the corresponding cavity 142 of the cover 140 by engagement of the barbs 96 therewith, and the lower contact 100 is loaded, from the bottom, into the corresponding cavity 124 by engagement of the barbs 106 therewith. When a chip carrier 180 is received and retained within the socket, the engagement bars 124 of the base 120 engage the corresponding portions of the cover 120, and in this state the cavities 122 of the base 120 are respectively aligned to the corresponding cavities 142 of the cover 140 such that the distal end of each upper contact retention section 94 extends into the corresponding cavity 122 of the base 120 and is retentively clamped by the fork type retention section 104 of the corresponding lower contact 100 therein. On the other hand, the contact section 98 of the upper contact 90 presses the free end 182 of the corresponding lead 183 against the wall 126 of the base 120. Similar to that in the first embodiment, the contact section 98 of the contact 90 exerts an obliquely upward force which presses the fixed end 183 of the lead 181 of the chip carrier 180 against the retention section 144 of the cover 140 for retention of the chip carrier 180 in the socket.

It can be seen that in the second embodiment the engagement between the pin type retention section 94 of the upper contact 90 and the fork type retention section 104 of the lower contact 100 provides not only the electrical communication for transferring the signals from the chip carrier 180, through the lead 180, to the board 200 on which the socket is seated, but also retention means for assembling the cover 140 and the base 120 together without the need of other latch means as used in the most current sockets.

While the invention has been described in connection with what is presently considered to be the most practical and preferred embodiments, it is to be understood that the invention is not limited to the disclosed embodiment but, on the contrary, is intended to cover various modifications and equivalent arrangements included within the spirit and scope of the appended claims.

Therefore, persons of ordinary skill in this field are to understand that all such equivalent structures are to be included within the scope of the following claims:

What is claimed is:

1. A chip carrier socket assembly for electrically connecting leads on a chip carrier to a board on which the socket is seated, wherein the leads are spaced apart and projecting from a peripheral edge of the chip carrier, said socket comprising:
    a base having a chip carrier receiving first opening therein;
    a plurality of first slots positioned in the base in surrounding relation to the first opening;
    a plurality of lower contacts respectively received in the corresponding first slots;
    a cover having a second through-opening therein corresponding to the first opening of the base;
    a plurality of second slots positioned in the cover in surrounding relation to the second opening and in alignment with the first slots of the base, respectively; and
    a plurality of upper contacts loaded into the cover from the top and respectively received in the corresponding second slots so that when the chip carrier is implanted within the socket, the chip carrier occupies the second through-opening and is almost flush with a top surface of the cover thereby reducing a height of the socket assembly, and leads of the chip carrier are sandwiched between the upper contacts and the lower contacts for electrical and mechanical engagement.

2. The chip carrier socket assembly as described in claim 1, wherein latches are disposed on the base with first protrusions provided thereon, and through-recesses are disposed in the cover with second protrusions provided therein so that the cover and the base can be fixedly fastened together with the chip carrier therein by the engagement of the first protrusions and the second protrusions.

3. The chip carrier socket assembly as described in claim 1, wherein the leads respectively project into the corresponding second slots of the cover for precise engagement with the corresponding upper contacts and lower contacts.

4. The chip carrier socket assembly as described in claim 1, wherein a plurality of first walls peripherally surround the first opening of the base and the first slots are formed in the walls.

5. The chip carrier socket assembly as described in claim 4, wherein the base further comprises a plurality of first cavities respectively corresponding to the first slots each for receiving a retention section of the lower contact therein, and each lower contact comprises a contact section spaced apart from said retention section and received within the first slot of the base.

6. The chip carrier socket assembly as described in claim 4, wherein the base comprises an upstanding engagement bar spaced apart from each first wall thereby forming a channel therebetween.

7. The chip carrier socket assembly as described in claim 6, wherein the cover comprises a plurality of second walls peripherally facing the second through-opening of the cover.

8. The chip carrier socket assembly as described in claim 7, wherein the cover further comprises a plurality of retention sections parallel to the second walls, respectively, in abutment with the leads of the chip carrier for preventing upward movement of the chip carrier.

9. The chip carrier socket assembly as described in claim 7, wherein each wall including an outer section for engagement with the engagement bar of the base, and an inner section being received within the channel of the base.

10. The chip carrier socket assembly as described in claim 9, wherein each upper contact has a retention section for engagement with the cover and a spaced contact section for engagement with the lead of the chip carrier.

11. The chip carrier socket assembly as described in claim 10, wherein the second slots of the cover are formed in the inner sections of the second walls to respectively receive the corresponding contact sections of the upper contacts therein, and a plurality of second cavities are formed in the outer sections of the second walls in alignment with and in communication with the corresponding second slots of the cover for respectively receiving retention sections of the upper contacts therein.

12. A chip carrier socket assembly for electrical connecting leads on a chip carrier to a board on which the socket is seated, wherein the leads each comprising a fixed end and a free end, are spaced apart and projecting from a peripheral edge of the chip carrier, said socket comprising:
- a base having a central first opening for receiving the chip carrier therein;
- a cover having a second opening in alignment with the first opening of the base;
- a plurality of upper contacts positioned on the cover and side by side arranged around the second opening; and
- retention section means surrounding said second opening of the cover so that when the chip carrier is implanted within the second opening of the cover, each upper contact exerts an inward and upward force on the corresponding free end of the corresponding lead thereby pressing the fixed end of the lead against the retention section means and retaining the chip carrier within the second opening.

13. The chip carrier socket assembly as described in claim 12, wherein the base comprises a plurality of lower contacts corresponding to and in alignment with the upper contacts of the cover for engagement with the corresponding leads of the chip carrier.

14. The chip carrier socket assembly as described in claim 13, wherein the base includes engagement bars and latches for latchable engagement with outer sections of the cover when the socket is assembled.

15. A chip carrier socket assembly for receiving a chip carrier therein, comprising:
- a base having a first opening for receiving the chip carrier therein;
- a plurality of lower contacts positioned on the base in surrounding relation to the first opening;
- a cover having an approximate shape and outer dimensions of the base; and
- a plurality of upper contacts positioned on the cover in alignment with the corresponding lower contacts of the base so that the upper contacts of the cover latchably engage the lower contacts of the base when the socket is assembled thereby requiring no additional latch means.

16. The chip carrier socket assembly as described in claim 15, wherein the upper contact is of a pin type and the lower contact is of a tuning fork type so that the lower contact can adequately clamp the upper contact when assembled.

17. The chip carrier socket assembly as described in claim 15, wherein each lower contact is positioned in a first cavity of the base, each upper contact is positioned in a second cavity of the cover, and said first cavity of the base communicates with said corresponding second cavity of the cover.

18. The chip carrier socket assembly as described in claim 15, wherein the lower contacts are connected to the leads through the upper contacts.

* * * * *